United States Patent [19]

Streifer et al.

[11] 4,111,521

[45] Sep. 5, 1978

[54] SEMICONDUCTOR LIGHT REFLECTOR/LIGHT TRANSMITTER

[75] Inventors: William Streifer, Palo Alto; Donald R. Scifres; Robert D. Burnham, both of Los Altos, all of Calif.

[73] Assignee: Xerox Corporation, Stamford, Conn.

[21] Appl. No.: 761,105

[22] Filed: Jan. 21, 1977

[51] Int. Cl.$^2$ .......................... G02B 5/14; H01S 3/10
[52] U.S. Cl. ......................... 350/96.13; 331/94.5 C; 350/96.15
[58] Field of Search .......... 350/96 C, 96 WG, 160 R; 331/94.5 C

[56] References Cited

U.S. PATENT DOCUMENTS

| | | | |
|---|---|---|---|
| 3,320,013 | 5/1967 | Johnson | 350/96 WG |
| 3,920,314 | 11/1975 | Yajima | 350/96 C |
| 3,957,340 | 5/1976 | Giallorenzi | 350/96 WG |
| 4,007,978 | 2/1977 | Holton | 350/96 C |

*Primary Examiner*—John K. Corbin
*Assistant Examiner*—Stewart Levy
*Attorney, Agent, or Firm*—James J. Ralabate; Sheldon F. Raizes; Leonard Zalman

[57] ABSTRACT

A semiconductor device which utilizes interferometric principles and electrical control to provide either light reflection or light transmission or partial light reflection/transmission. In a preferred embodiment, the device includes an input waveguide which divides into branch waveguides, with the branch waveguides being reunited at an output waveguide. When the optical path lengths of the branched waveguides varies by an integer multiple of the light wavelength in the guides, the light waves interfere constructively at the output waveguide causing light to be transmitted into the output waveguide. When the light wave in one branch waveguide undergoes a single pass phase shift of 180° relative to the light wave in the other branch waveguide, the light waves interfere at the output waveguide and are caused to return to the input waveguide through the branch waveguides. The returning light wave in the one branch waveguide once again experiences a single pass 180° phase shift relative to the light wave in the other branch waveguide such that the light waves are in phase at the input waveguide and the device appears as a reflector to a light source coupled to the input waveguide. Electrodes may be applied to one or both branch waveguides. Upon application of an electric field to the electrodes the relative optical path lengths of the branched waveguides will be changed allowing electrical control of the strength of the light reflection or transmission.

2 Claims, 14 Drawing Figures

SEMICONDUCTOR LIGHT REFLECTOR/LIGHT TRANSMITTER

BACKGROUND OF THE INVENTION

The semiconductor diode laser is a p-n junction device which lases when a forward bias voltage of at least 1.5 volts is applied to the device. The voltage drives either holes or electrons or both across the p-n junction and when the holes and electrons recombine they emit light. For an instant before the holes and electrons recombine, they can be "stimulated" by light to emit more light coherently. This stimulated emission phenomenon is equivalent to providing amplification and is related to the first of two requirements for laser oscillation. Specifically, a first requirement is that there be sufficient gain or amplification of the light within the laser to overcome all losses. The second requirement for laser oscillation is an optical feedback mechanism. Optical feedback is provided in conventional diode lasers by simply "cleaving" the faces of the semiconductor crystal. These cleaves form plane parallel mirror-like surfaces which reflect a portion of the light back into the region of the p-n junction. The reflected light is amplified and the energy density within the laser continues to build-up to produce the very intense laser beam.

Several problems have thus far tended to reduce the usefulness and versatility of the described "cleaved-faced" diode laser. First, these diode lasers often fail within tens to hundreds of hours of usage because of damage caused by the high intensity of the light incident on the cleaved mirrors. Secondly, and equally important, no means is known for integrating these diode lasers into an integrated optical system.

To overcome those problems, lasers which do not require cleaved crystal faces to provide feedback have been proposed. The first, which in its various implementations has been referred to as distributed feedback or distributed Bragg reflectors, utilizes a grating-like structure within or adjacent to the active (lasing) region. The grating consists of hundreds of equally spaced corrugations each of which acts as a tiny reflector or mirror. The grating spacing is an integral multiple of the light wavelength generated within the laser such that the reflections from the corrugations are in phase whereby the energy density within the active region builds up to produce the very intense laser beam. A second type of laser not requiring cleaved crystal faces uses an index discontinuity, which can be created by etching, etching and regrowth, or simply growth.

A drawback of all of the lasers described is that the reflector or feedback mechanism is not readily available to electrical control. A laser with such electrical control would lend itself greatly to integration into complex but easily manufactured multi-component integrated optical circuits.

OBJECTS OF THE INVENTION

An object of the present invention is to provide a solid-state transmitter/reflector for integrated optical circuits.

A further object of the present invention is to provide a solid-state reflector/transmitter having electrical control of the reflector/transmitter mechanism.

A further object of the present invention is to provide a solid-state light amplitude modulator.

SUMMARY OF THE INVENTION

In accordance with the invention, there is provided an integrated optical system having an integrated light reflecting or transmitting structure which is not of the cleaved face or distributed feedback type. The reflector/transmitter of the present invention, referred to as an interferometric reflector/transmitter, utilizes interferometric principles and can be electrically controlled.

Structurally, one form of the integrated optical reflector/transmitter structure would include an input waveguide which branches into two waveguides which then recombine into a single output waveguide. The input waveguide is coupled to a diode laser which emits light of a wavelength to which all the waveguides are transparent. Either or both of the waveguide branches may have an electrode associated therewith. In operation, light from the laser propogates in the input waveguide and then divides at the branch waveguide junction to provide light of equal intensity in each waveguide branch. With no voltage applied to the electrode or electrodes associated with the waveguide branches, and identical branch waveguides of equal length, the light in both branch waveguides arrives in phase at the output waveguides where the light from the branch waveguides combines and excites the output waveguide to provide light transmission, that is, an absorbing termination.

When a voltage is applied to a branch electrode, the equivalent refractive index of that branch waveguide changes, resulting in a change in the wavelength or phase of the light in that branch. If the voltage applied to the electrode of a branch waveguide causes the light in that branch waveguide to experience a 180° phase shift relative to the light in the other branch waveguide, the two light waves are out of phase at the input to the output waveguide and the output waveguide is not excited. Thus, the system can act as an amplitude modulator which amplitude modulates the light in the output waveguide in accordance with the voltage applied to the electrode (or electrodes).

Considering again the case of the out of phase waves, the power in these waves is reflected back into the waveguide branches where the light in the electrode-excited branch once again experiences a 180° phase shift relative to the light in the other branch waveguide so that the light traveling in the waveguide branches arrives at the input waveguide in phase and combines to excite a wave in the input waveguide. If an active pumped region, such as the active pumped region of a diode laser, is coupled to the input waveguide, the waveguide structure simply appears as an integral reflector. The interferometric reflector together with another reflector (cleaved crystal facet, periodic structure or an additional interferometric reflector, etc.) at the other boundary of the active pumped region, will form a laser cavity.

DETAILED DESCRIPTION OF THE INVENTION

Figure 1:
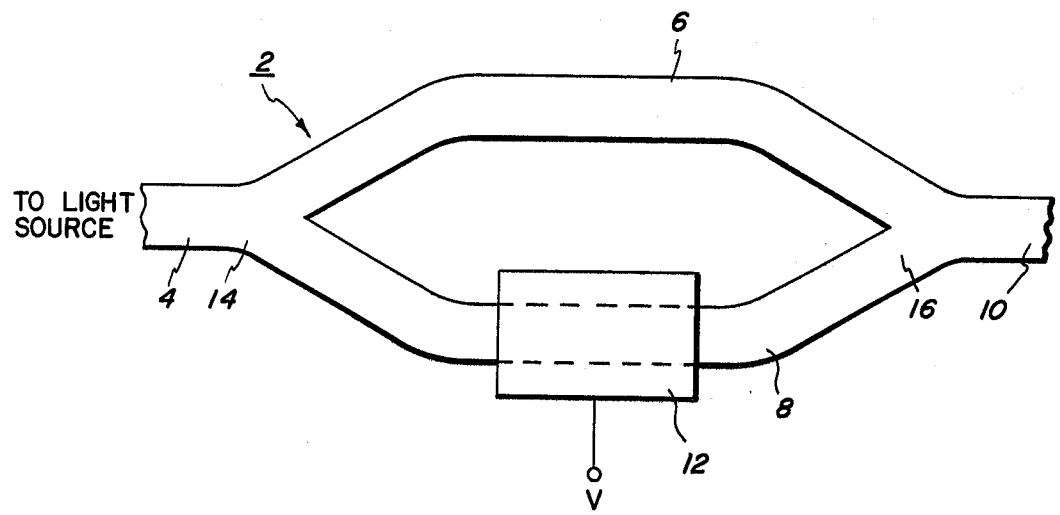
FIGS. 1 and 1A are a schematic representation of an interferometric reflector/transmitter in accordance with the invention.

Referring now to FIG. 1, there is shown schematically an integrated interferometric reflector/transmitter, amplitude modulator device 2 in accordance with the invention. The device 2 consists of an input waveguide 4 which branches into two identical symetrical mode waveguides 6 and 8. The branch waveguides 6 and 8 recombine into a single output waveguide 10. The branch waveguide junctions 14 and 16 can be considered as three db couplers, signifying that light propogating in the input or output waveguides is divided equally at the branch waveguide junctions. The light beam supplied to the input waveguide 4 is of a waveguide to which the input, branch and output waveguides is transparent.

The waveguide branch 8 has an electrode 12 associated therewith which, when coupled to a voltage source V, will impress an electrostatic field across a portion of the branch waveguide 8. As is well known, the electrostatic field is effective to cause a change in the carrier concentration in the portion of the branch waveguide exposed to the field. The change in carrier concentration causes a change in the equivalent refractive index of the portion of the branch waveguide 8 which causes the wavelength of light in the branch waveguide 8 to change since the wavelength of light in a material is inversely proportional to the equivalent refractive index of the material, that is, $\lambda g = \lambda_o/n_{eq}$ where $\lambda g$ is the wavelength in the guide, $\lambda_o$ is the free space wavelength, and $n_{eq}$ is the equivalent refractive index of the waveguide. Electrostatic fields may also produce refractive index changes in some materials via the electro-optic effect.

Light propagating in the input waveguide 4 is divided approximately equally at the branch waveguide junction 14 such that light beams of equal intensity enter waveguide branches 6 and 8. With no voltage applied to electrode 12 and with branch waveguides 6 and 8 of the same material (or materials of equal refractive index) and equal length, or of material and length such that the optical path length differs by an integral multiple of the wavelength, the light beams in both branch waveguides arrive in phase at the output junction 16. At junction 16 the light beams combine, and, being in phase, excite the output waveguide 10 to provide light transmission.

When a voltage is supplied to electrode 12, the refractive index of a portion of branch waveguide 8 is changed, as explained previously, such that the light wave in branch waveguide 8 experiences a phase shift relative to the light wave in branch waveguide 6. If the voltage applied to electrode 12 is of such magnitude as to cause the light wave in branch waveguide 8 to experience a 180° phase shift relative to the light in branch waveguide 6, the two light waves are out of phase at junction 16 and the output waveguide 10 is not excited. Thus, the device 2 can act as a light modulator, transmitting fully when no voltage is applied to electrode 12, transmitting no light when the voltage applied to electrode 12 causes a 180° phase shift of the light wave in waveguide branch 8 relative to the light wave in branch waveguide 6, and transmitting, but not fully, when the voltage applied to electrode 12 causes other than a 180° phase shift between the light waves in branch waveguides 6 and 8.

Considering again, the case of the 180° out of phase light waves, these waves interfere and the power in these waves is reflected back equally into branch waveguides 6 and 8. The light waves reflected back into branch waveguide 8 experience another 180° phase shift relative to the light wave in branch waveguide 6 due to the voltage applied to electrode 12 so that the light waves arriving at junction 14 from waveguide branches 6 and 8 are in phase; the light waves combining to excite a light wave in the input waveguide 4. Thus, if an active pumped light source region (not shown in FIG. 1) is coupled to waveguide 4, the entire device 2 will appear (1) as a reflector when the voltage applied to electrode 12 produces a 180° phase shift to the light wave in branch waveguide 8 relative to the light wave in branch waveguide 6 and (2) as an absorbing termination when there is no phase difference between the light waves in branch waveguides 6 and 8.

Figure 1A:
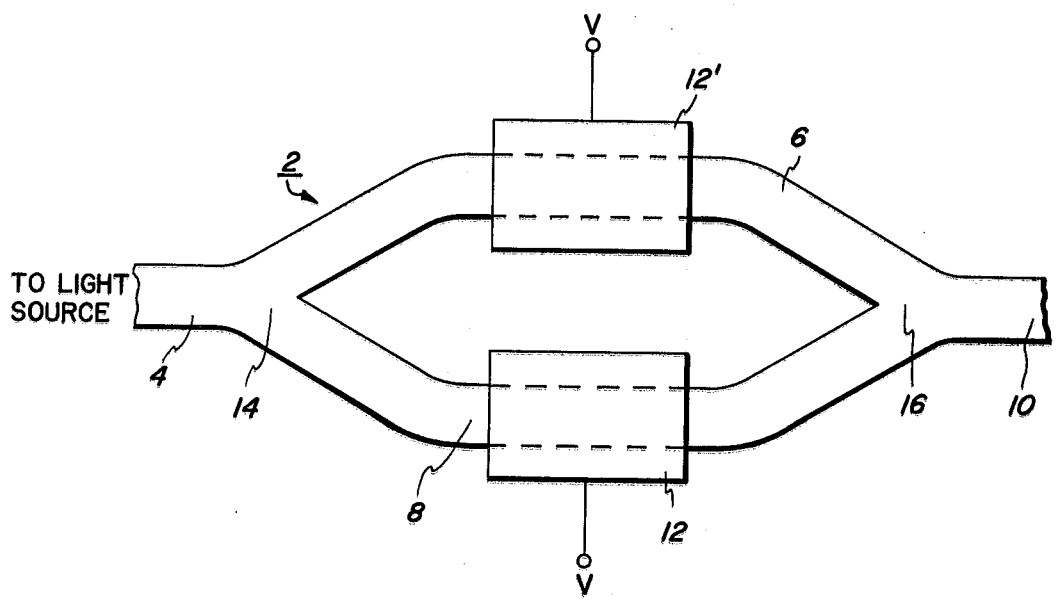

The integrated interferometric reflector/transmitter (IIR) of FIG. 1, together with some type of reflector at the other boundary of an active pumped light source region, will form a laser cavity. It is noted at this point that the required in phase transmission of light in branch waveguides 6 and 8 or the 180° phase shift in the light waves in waveguide branches 6 and 8 can be achieved by means of an electrode 12 associated with branch 8 and an additional electrode 12' associated with waveguide branch 6 (as shown in FIG. 1A), with the voltage applied to these electrodes being of such magnitude as to cause in phase or out of phase transmission to output waveguide 10.

Considering now some of the requirements for device performance, clearly if the waveguides introduce loss, either through absorption, radiation at bends, or imperfect coupling, device performance will suffer. For example, if the single pass loss in each branch were 50%, then even if ideal operation were achieved in every other respect, the maximum power reflection would be 25%, although the modulation at the output could be 100%. If branches 6 and 8 were not of equal optical length or did not differ by an exact integral multiple of the guide wavelength, the device should still function, but between two non-zero electrode voltages. Let us examine this situation together with the question of wavelength sensitivity. Say the physical lengths of waveguide branches 6 and 8 are $L_6$ and $L_8$. Now let $l(V,\lambda_o)$ be the effective additional waveguide length of $L_6$ as seen by a guided wave with free-space wavelength $\lambda_o$. For example, if the refractive index as a function of voltage satisfied $$n(V,\lambda_o) = n_o(\lambda_o) [1 + c(\lambda_o) V], \quad (1)$$

where $c(\lambda_o)$ is an "electro-optic" coefficient and $V$ is the electrode voltage, then $$l(V,\lambda_o) = n_o(\lambda_o) c(\lambda_o) VL_E \quad (2)$$

where $L_E$ is the physical length of the electrode. At some voltage $V_1$, at a particular free-space wavelength $\lambda_o$ and corresponding guide wavelength $$\lambda_g = \lambda_o/n_{eq}(\lambda_o), \quad (3)$$

where $n_{eq}(\lambda_o)$ is the equivalent guided wave index, the difference in path length will equal an integer plus a half $\lambda_g$, i.e.

$$L_6 - L_8 + l(V_1,\lambda_o) = (p + \tfrac{1}{2})\lambda_g, \quad (4)$$

where $p$ is an integer. With $V = 0$, $L_6 - L_8$ is assumed to be within $\lambda_g/2$ of the above value.

At these values, $V_1$ and $\lambda_o$, the light waves in branches 6 and 8 destructively interfere and the reflectivity of the IIR is a maximum. To determine the shift in wavelength to the adjacent maxima, $$L_6 - L_8 + l(V_1, \lambda_o + \Delta\lambda_o) = (m + \tfrac{1}{2})(\lambda_g + \Delta\lambda_g), (m = p \pm 1) \quad (5)$$

we expand about $\lambda_o$ in Eq (5) and employ (3) and (4). Then by retaining only first order terms in $\Delta\lambda_o/\lambda_o$, we obtain $$\Delta\lambda_o/\lambda_o = \pm [n_{eq} dl_1/d\lambda_o - (p + \tfrac{1}{2})(1-D)]^{-1} \quad (6)$$

where $$D = (\lambda_o/n_{eq})(dn_{eq}/d\lambda_o), \quad (7)$$

and $$\frac{dl_1}{d\lambda_o} = V_1 L_E \left[ c(\lambda_o) \frac{dn_{eq}}{d\lambda_o} + n_{eq} \frac{dc}{d\lambda_o} \right]. \quad (8)$$

Since $(V_1, \lambda_o)$ as given by (2) is on the order of $\pm \lambda_g/2$ and since the second bracketed term in (8) may be negligible, Eq. (6) becomes $$\Delta\lambda_o/\lambda_o \approx \pm [\pm D/2 - (p + \tfrac{1}{2})(1-D)]^{-1}. \quad (9)$$

Finally with $D \approx -0.3$, for GaAs away from the band edge the IIR has almost no wavelength selectivity for small values of $p$; however, large values of $p$ are almost unavoidable. Thus, for example if $p \approx 100$, and $\lambda_o = 8500 \text{Å}$, $$\Delta\lambda_o \approx \pm 64 \text{Å}$$

or the maximum and minimum reflectance wavelengths are separated by $\approx 32$ Å.

As will all lasers, wavelength is determined by the frequency selective properties of both the gain medium and the reflectors. For GaAs:GaAlAs lasers with a fairly broadband gain characteristic, at threshold the laser will operate at the peak reflectance of the IIR; however, in practice some output power will always be coupled into the output waveguide.

The light source associated with the described interferometric reflector/transmitter device can be any type of semiconductor diode laser, such as, for example, a single heterojunction diode laser, a double heterostructure diode laser, or a homojunction diode laser. As noted, the only condition on the diode laser is that it produces light of a wavelength to which the various waveguides are transparent. The integrated interferometric reflector will provide optical feedback at one end of the active laser region (when one branch waveguide has a single pass phase change of 180°), with the other end of the active laser region providing feedback by a cleaved or grown facet, distributed feedback grating, or another integrated interferometric reflector. Light from the laser can be transferred into the input waveguide (transparent to the laser wavelength) by use of butt coupling, taper coupling, evanescent wave coupling or other standard coupling arrangements known in the art.

Regarding the branch waveguide 6 and 8, these waveguides should be as close to symetric as possible to provide an even division of the light wave in the input waveguide 4. Also, the branch waveguide 6 and 8 should be single mode guides and the bends in the branch waveguides should not be so sharp as to cause high optical losses. For example, bends of ½mm radius would not provide excessive optical losses for refractive index differences of 0.02 and waveguide widths of 20 μm.

Figure 2:
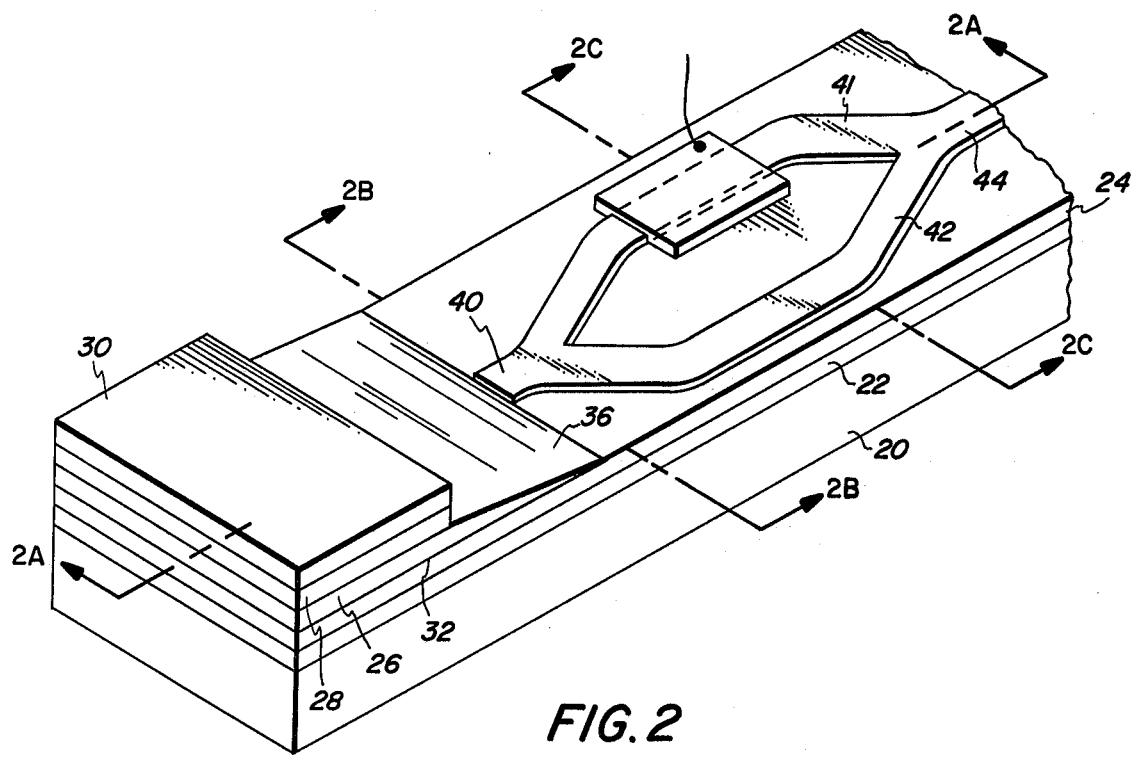
FIGS. 2, 2A, 2B, and 2C are an embodiment of an exemplary interferometric reflector/transmitter system.
Figure 2A:
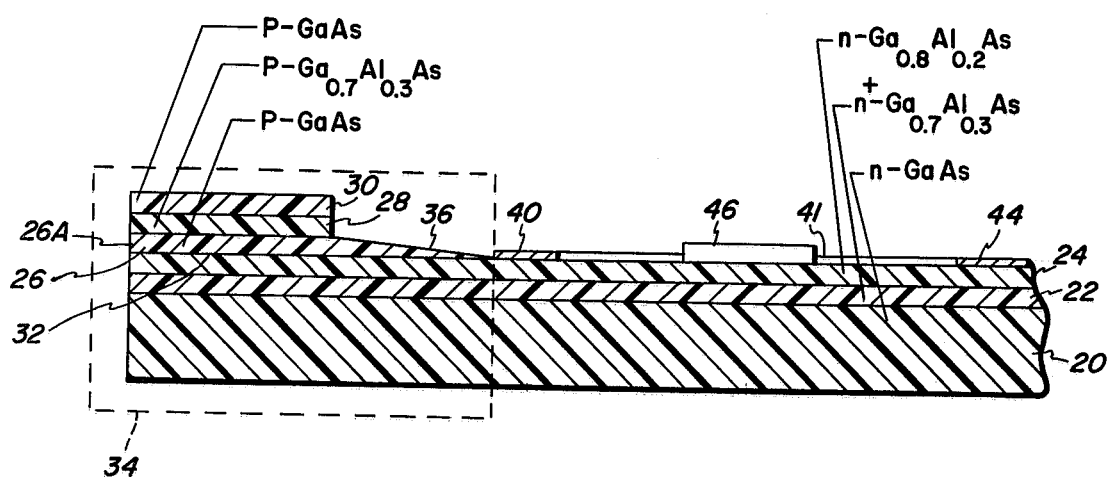
Figure 2C:
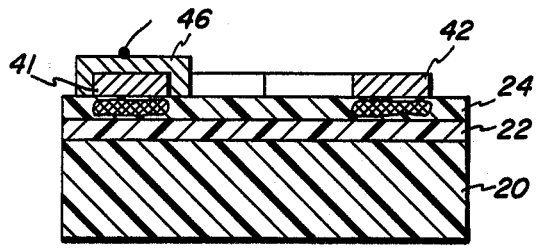
Figure 2B:
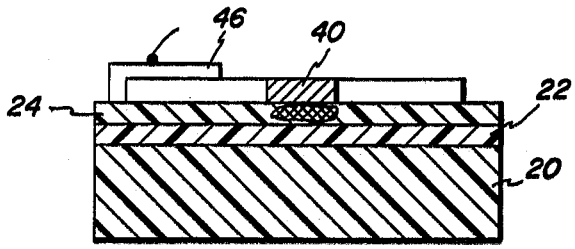

A specific form of the integrated interferometric reflector/transmitter with diode laser input source which is taper coupled into the input waveguide is shown schematically in FIG. 2 and in cross-section in FIGS. 2A, 2B, and 2C. As shown, the solid-state device includes a substrate 20, a light confining layer 22, a light waveguide layer 24, a laser active region 26, a light confining layer 28, and a contact facilitating layer 30. The layers 22 and 24 are coextensive with the substrate 20, with the layers 26, 28 and 30 elevated with respect to layers 22 and 24 and substrate 20 and covering only a portion of layer 24. By way of example only, the substrate 20 can be n+- GaAs, the layer 22 can be n+-$Ga_{0.7}Al_{0.3}As$, the layer 24 can be n-$Ga_{0.8}Al_{0.2}As$, layer 26 can be p-GaAs, layer 28 can be p-$Ga_{0.7}Al_{0.3}As$, and the layer 30 can be p-GaAs, as shown in FIG. 2A. That doping configuration provides a rectifying junction 32 at the interface of layers 24 and 26. The layers 26 and 28 and 30, and the portions of layers 22, 24, and substrate 20 aligned therewith define a conventional double heterojunction diode laser 34. As is well known, in such a double heterojunction structure the active region layer 26 is boardered by layers of material having a lower index of refraction than the material of the active region layer. When a forward bias is applied to the laser device by electrodes (not shown) on the outer surfaces of layer 30 and substrate 20, electrons or holes or both are driven across rectifying junction 32, with the holes and electrons recombining to emit light. Confinement of the light produced is provided by layers 24 and 28 since the emitted light prefers to remain in the layer having the higher refractive index. Optical feedback can be provided at one side 26A of the active region layer 26 of laser 34 by simply "cleaving" the crystals on that side of layer 26. Optical feedback can be provided at the other side of the active region layer 26 by the interferometric reflector/transmitter of the invention.

If the light generated in the active region layer 26 remain therein it would be absorbed. Accordingly, it is necessary to divert at least a portion of the light into a material having a different composition than the composition of layer 26. This diversion can be achieved by tapering the portion of layer 26 remote from the cleaved side 26A of layer 26, a taper of approximately 100 μm being sufficient. The tapered portion 36 of layer 26 causes at least a portion of the light emitted by the active region layer 26 to be diverted into the layer 24. The diverted light will remain in layer 24 since that layer has a higher refractive index than layer 22, due to its lower aluminum content and lower doping concentration relative to layer 22.

As shown in FIGS. 2, 2A, 2B, and 2C, the portion of layer 24 extending beyond layer 26 has deposited on its surface a layer of silicon nitride ($Si_3N_4$) having a first portion 40, branch portions 41 and 42, and a second portion 44. As previously noted, the light prefers to travel in the region having the highest refractive index. Since silicon nitride has a higher refractive index than air (about 1.8 compared to 1), the equivalent refractive index is highest under the layer of silicon nitride than at any other portion of layer 24. Hence, laser light in layer 24 is confined to the regions of layer 24 below the silicon nitride portions, as shown schematically in FIGS. 2B and 2C wherein the shaded regions 50 denote the paths of the laser light waves. Accordingly, the region of layer 24 beneath the portion 40 of the silicon nitride layer acts as the previously mentioned input waveguide, the regions of layer 24 beneath the portions 41 and 42 of the silicon nitride layer act as the previously mentioned branch waveguides, and the region of layer 24 beneath the portion 44 of the silicon nitride layer acts as the previously mentioned output waveguide. In accordance with the previous teaching, an electrode 46, covering part of the portion 41 of the silicon nitride layer, is supplied a voltage sufficient to cause the wave traveling in the waveguide branch associated therewith to have a 180° phase shift relative to the light wave in the other waveguide branch if it is desired that the interferometric device act as a light reflector. The absence of a voltage on electrode 40 provides throughput light transmission as previously discussed. Thus, the device of FIG. 2 can act as a modulator which modulates the laser light in accordance with the voltage applied to electrode 46.

To provide for some light reflection and some light transmission, the waveguide branches can be made slightly asymmetric so that equal power is not coupled into each branch guide. When a voltage of sufficient magnitude is applied to electrode 46 to cause a 180° single pass phase shift between the light waves in the two branch waveguides, the light waves arrive at the output waveguide out of phase due to the electrostatic field and with different intensities due to the asymetric coupling into the branched guides. The weaker wave will interfere with a portion of the stronger wave causing some light reflection, with the remaining portion of the stronger wave being transmitted. In this way, the device can simultaneously act as both a light reflector and light transmitter.

Figure 3A:
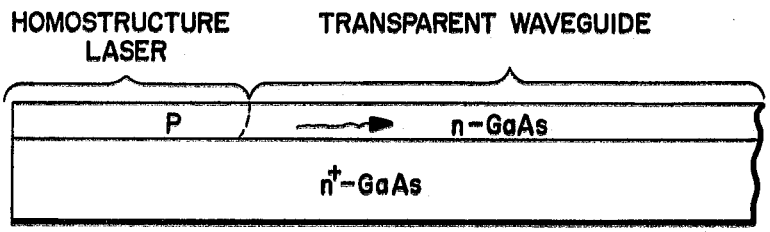
FIGS. 3A, 3B, 3C, 3D and 3E are examples of ways to couple light from a light source into a waveguide structure.
Figure 3B:
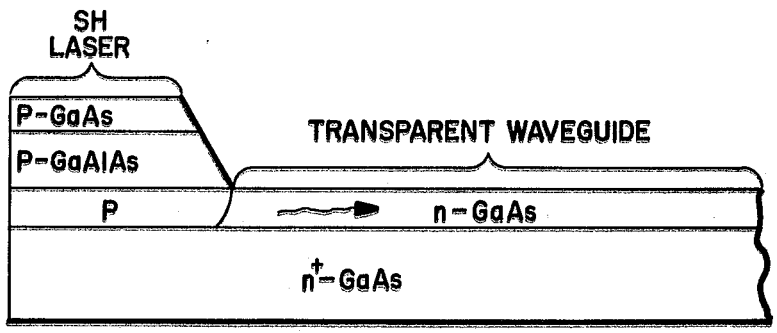
Figure 3C:
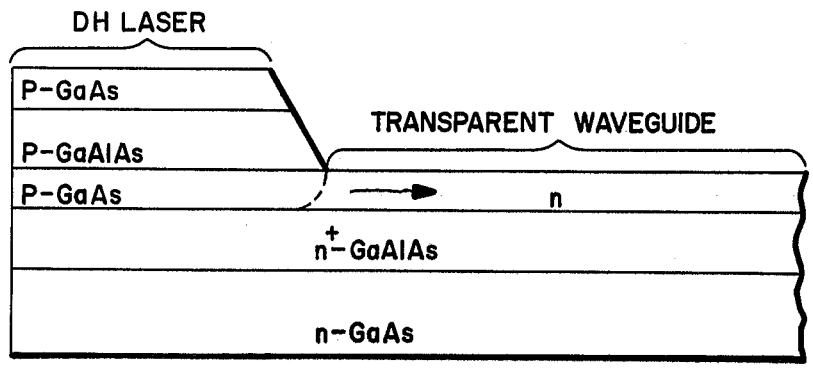
Figure 3D:
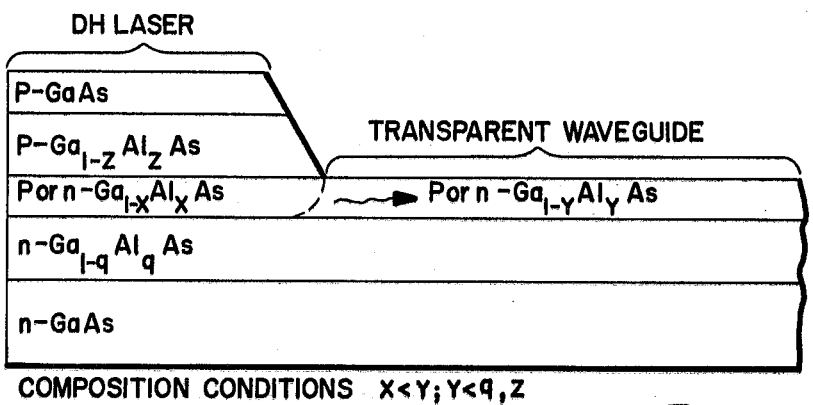
Figure 3E:
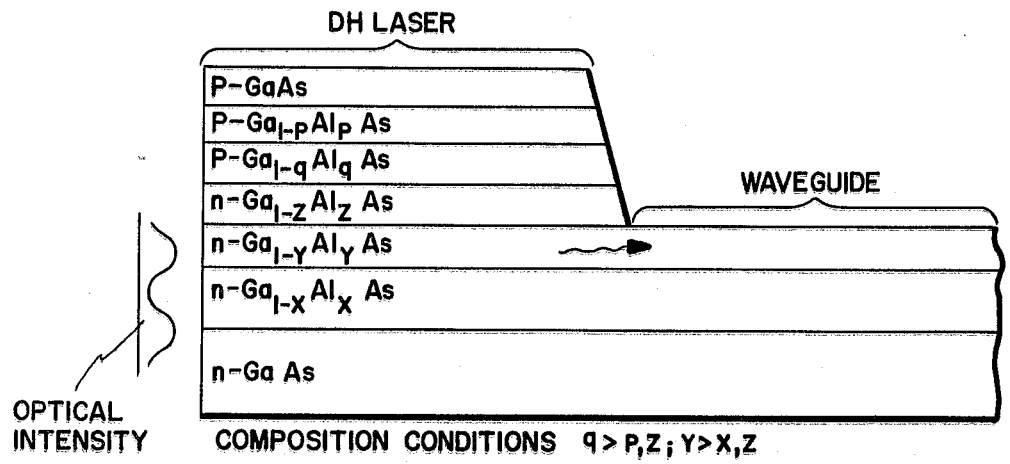

The structure of FIG. 2 can be made by conventional liquid phase epitaxy or molecular beam epitaxy growth techniques, and standard photolithographic and radio frequency sputtering techniques. As noted, the structure of FIG. 2 is only an exemplary form of the laser structure, coupling structure, and interferometric reflector/transmitter structure that can be utilized. FIG. 3 shows other structures for coupling light from a laser into a light waveguide. In FIGS. 3A, 3B, 3C and 3D the laser (on the left side) is coupled to the light waveguide (on the right side) by butt coupling via a change in conductivity type since light generated in a material of one conductivity type is not readily absorbed by a region of that material of the other conductivity type. FIG. 3E depicts an evanescent wave coupler, with the optical mode intensity from the active region spreading to the waveguide layers.

Figure 4A:
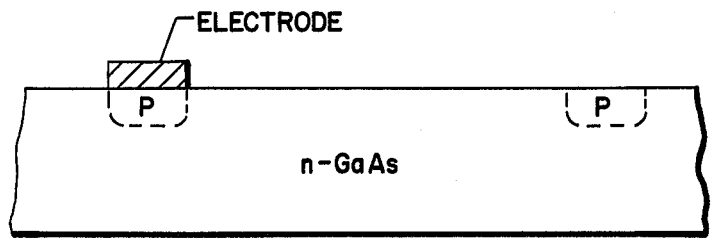
FIGS. 4A, 4B and 4C are examples of light waveguide structures.
Figure 4B:
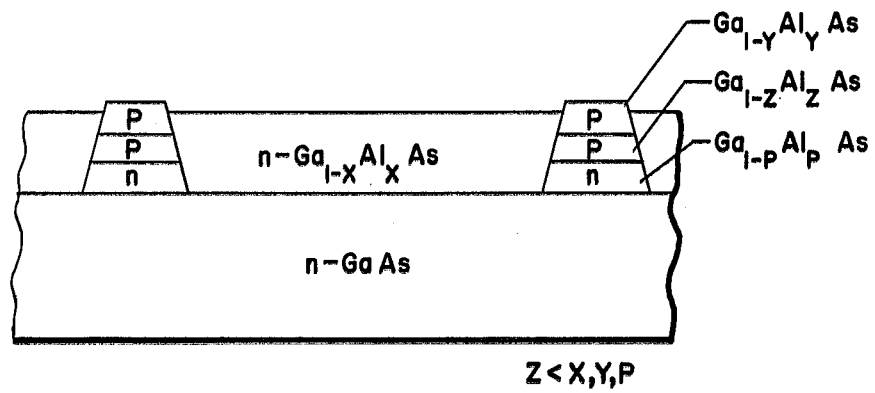
Figure 4C:
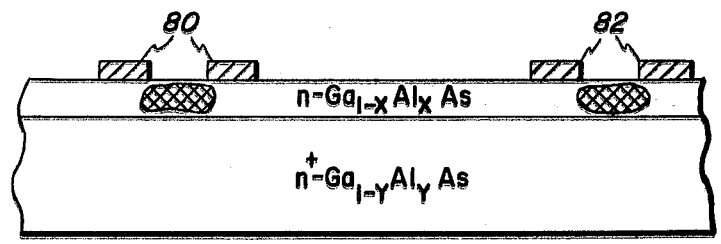

The waveguides can also be formed by differences in conductivity type as shown in FIG. 4A which is a cross-sectional view similar to section c—c of FIG. 2A. In FIG. 4A the p-type regions provide a higher equivalent refractive index in the vicinity thereof, which causes the waves to be guided along those regions. In FIG. 4B, the raised (Mesa-like structures) cause the equivalent refractive index adjacent thereto to be higher which causes the light waves to be guided therealong. In FIG. 4C, the pairs of metal electrodes 80 and 82 cause the equivalent refractive index therebetween to be higher than the surrounding areas which causes the light waves to be guided between the pairs of electrodes as shown by the cross-hatching.

We claim:
1. A semiconductor body including:
a solid state laser cavity defined by an active region boarded by a rectifying junction and a pair of light feedback means,
one of said light feedback means including a first elongated light guiding region and a second elongated light guiding region, said first and second elongated light guiding regions originating from a first common region and terminating at a second common region,
first means for forward biasing said rectifying junction to produce light output from said active region,
second means for guiding the light output of said active region into said first common region whereby portions of said light output are guided between said first and second common regions via said first and second elongated regions, and
third means for regulating the relative phase of the light traveling in said first and second elongated regions to provide, depending on said relative phase, total or partial light reflection at said second common region.

2. A semiconductor body including:
a solid state laser cavity defined by an active region boarded by a rectifying junction and a pair of light feedback means,
one of said light feedback means including a first elongated light guiding region and a second elongated light guiding region, said first and second elongated light guiding regions originating from a first common region and terminating at a second common region,
first means for forward biasing said rectifying junction to produce light output from said active region,
second means for guiding the light output of said active region into said first common region whereby portions of said light output are guided between said first and second common regions via said first and second elongated regions, and
third means for regulating the relative path length of said first and second elongated regions to provide, depending on said relative path length, total or partial light reflection at said second common region.

* * * * *